United States Patent
Xie et al.

(10) Patent No.: US 11,349,001 B2
(45) Date of Patent: May 31, 2022

(54) REPLACEMENT GATE CROSS-COUPLE FOR STATIC RANDOM-ACCESS MEMORY SCALING

(71) Applicant: INTERNATIONAL BUSINESS MACHINES CORPORATION, Armonk, NY (US)

(72) Inventors: Ruilong Xie, Niskayuna, NY (US); Carl Radens, LaGrangeville, NY (US); Kangguo Cheng, Schenectady, NY (US); Veeraraghavan Basker, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 137 days.

(21) Appl. No.: 16/598,065

(22) Filed: Oct. 10, 2019

(65) Prior Publication Data
US 2021/0111028 A1    Apr. 15, 2021

(51) Int. Cl.
| H01L 21/8238 | (2006.01) |
| H01L 27/11 | (2006.01) |
| H01L 29/417 | (2006.01) |
| H01L 27/092 | (2006.01) |
| H01L 29/66 | (2006.01) |
| H01L 29/40 | (2006.01) |
| H01L 29/78 | (2006.01) |

(52) U.S. Cl.
CPC ......... *H01L 29/41791* (2013.01); *H01L 21/823821* (2013.01); *H01L 21/823871* (2013.01); *H01L 21/823878* (2013.01); *H01L 27/0924* (2013.01); *H01L 27/1104* (2013.01); *H01L 29/401* (2013.01); *H01L 29/41775* (2013.01); *H01L 29/66515* (2013.01); *H01L 29/66545* (2013.01); *H01L 2029/7858* (2013.01)

(58) Field of Classification Search
CPC ..... H01L 21/823871; H01L 21/823475; H01L 21/823481; H01L 21/823878; H01L 21/823431; H01L 21/823821; H01L 21/76895; H01L 27/11–1112; H01L 29/401; H01L 29/41775; H01L 29/41791; H01L 29/66515; H01L 29/66545; H01L 2029/7858

See application file for complete search history.

(56) References Cited

U.S. PATENT DOCUMENTS

| 9,012,287 B2 | 4/2015 | Liaw |
| 9,293,466 B2 | 3/2016 | Liaw |
| 9,881,926 B1 | 1/2018 | Basker et al. |

(Continued)

FOREIGN PATENT DOCUMENTS

| CN | 109841562 A | * | 6/2019 | ....... H01L 21/76846 |
| KR | 20080092614 A | * | 10/2008 | |
| KR | 20180120870 A | * | 11/2018 | ......... H01L 23/5226 |

*Primary Examiner* — Yu Chen
(74) *Attorney, Agent, or Firm* — Cantor Colburn LLP; Samuel Waldbaum

(57) ABSTRACT

A method of fabricating a static random-access memory (SRAM) device includes forming a sacrificial material and replacing the sacrificial material with a metal to form a cross-couple contact on a metal gate stack. A portion of the metal gate stack directly contacts each of a sidewall and an endwall of the cross-couple contact.

12 Claims, 9 Drawing Sheets

(56) References Cited

U.S. PATENT DOCUMENTS

| | | | |
|---|---|---|---|
| 10,056,377 B2 | 8/2018 | Bentley et al. | |
| 10,083,971 B1 | 9/2018 | Zang et al. | |
| 10,090,193 B1* | 10/2018 | Chanemougame | ............................ H01L 29/0673 |
| 10,109,637 B1 | 10/2018 | Zang et al. | |
| 10,163,915 B1 | 12/2018 | Zang et al. | |
| 10,204,861 B2 | 2/2019 | Zhu et al. | |
| 10,326,002 B1* | 6/2019 | Zang | ............ H01L 29/66636 |
| 2017/0148799 A1* | 5/2017 | Basker | ............. H01L 21/76897 |
| 2017/0373161 A1* | 12/2017 | Schroeder | ........... H01L 21/7684 |
| 2018/0190780 A1* | 7/2018 | Lee | ................ H01L 21/823475 |
| 2019/0043758 A1 | 2/2019 | Zang et al. | |
| 2019/0081049 A1 | 3/2019 | Zang | |

* cited by examiner

REPLACEMENT GATE CROSS-COUPLE FOR STATIC RANDOM-ACCESS MEMORY SCALING

BACKGROUND

The present invention generally relates to fabrication methods and resulting structures for semiconductor devices. More specifically, the present invention relates to fabrication methods and resulting structures for replacement gate cross-coupling for static random-access memory (SRAM) scaling.

In contemporary semiconductor device fabrication processes, a large number of semiconductor devices, such as field effect transistors (FETs), are fabricated on a single wafer. Some non-planar device architectures, such as fin field effect transistors (finFETs) and finFET-based static random-access memory (SRAM), employ semiconductor fins and gates that can be contacted outside the active region, resulting in increased device density and some increased performance over lateral devices. A typical finFET device includes a fin that extends upward from the substrate. The gate can be formed over and around a portion of the fin. The portion of the fin that is under the gate defines the channel region of the transistor. The portions of the fin that are not under the gate form the source region and the drain region, respectively.

SUMMARY

Embodiments of the present invention are directed to a method for fabricating a memory device. A non-limiting example of the method includes forming a sacrificial material and replacing the sacrificial material with a metal to form a cross-couple contact on a metal gate stack. A portion of the metal gate stack directly contacts each of a sidewall and an endwall of the cross-couple contact.

Another non-limiting example of the method includes forming a sacrificial material and replacing the sacrificial material with a metal to form a cross-couple contact on a metal gate stack. At least a portion of the metal gate stack directly contacts each of a first sidewall and an endwall of the cross-couple contact, and the sacrificial gate material contacts a second sidewall of the cross-couple contact.

Embodiments of the present invention are directed to a memory device. A non-limiting example of the memory device includes a metal gate stack and a cross-couple contact arranged on the metal gate stack. The cross-couple contact includes a metal, a first sidewall, a second sidewall, and an endwall. A portion of the metal gate stack directly contacts each of the first sidewall and the endwall of the cross-couple contact.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-8C depicts a process flow for forming a SRAM device according to embodiments of the present invention, in which:

FIG. 1A depicts a top view of the SRAM device, subsequent to forming dummy gates, source/drain regions, and depositing an interlayer dielectric (ILD);

FIG. 2 depicts a top view of the SRAM device, subsequent to cross-couple patterning and etching;

FIG. 4 depicts a top view of the SRAM device, subsequent to patterning a mask for cutting the gate;

FIG. 8C depicts a cross-sectional side view through the Y1 axis, subsequent to removing any exposed gate dielectric and the protective layer, and then metallizing the source/drains and cross-couple contacts.

Figure 1A:
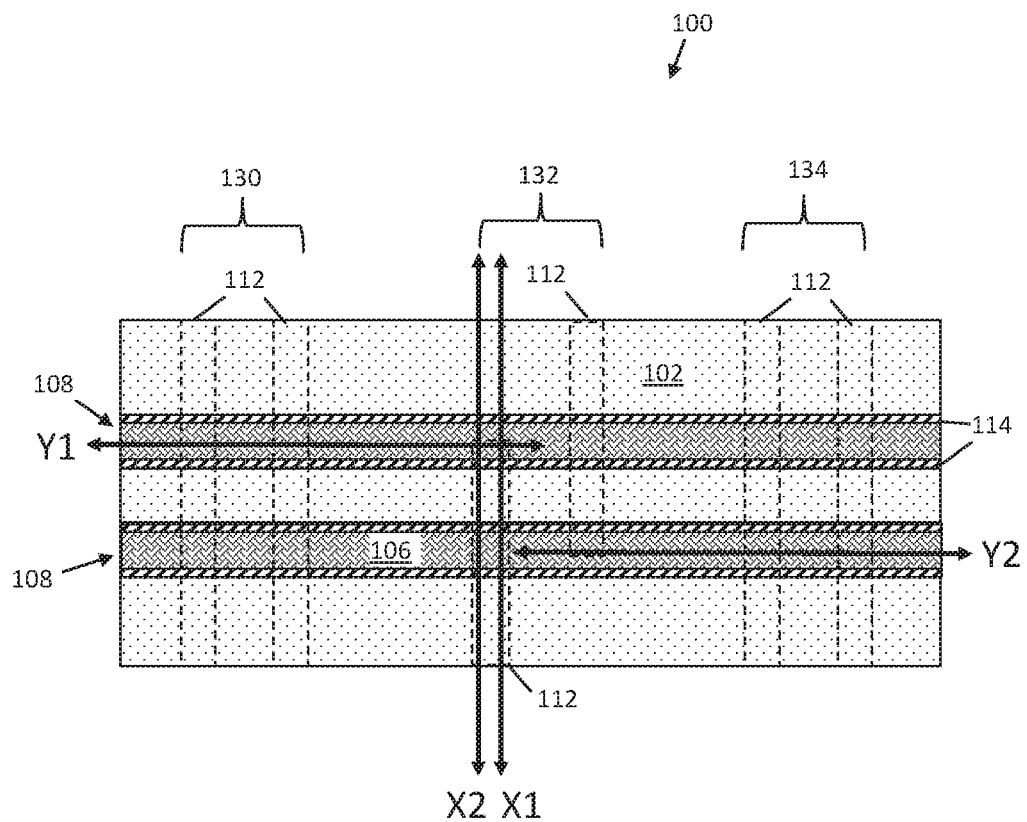

The diagrams depicted herein are illustrative. There can be many variations to the diagram or the operations described therein without departing from the spirit of the invention. For instance, the actions can be performed in a differing order or actions can be added, deleted or modified.

Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, SRAM cell design typically begins by selecting the smallest p-type field effect transistor (PFET) supported by a particular technology. Each SRAM cell includes two pass gate (PG) n-type field effect transistors (NFETs), two pull up (PU) NFETs, and two pull down PFETs.

Patterning and cutting the gate to form a cross-couple contact in SRAM devices become increasingly challenging as devices scale to smaller dimensions. The cross-couple contact forms an internal connection between the common gate of one inverter to the common source/drain of the other inverter. One reason for the challenge is due to patterning limitations. For example, the minimum critical dimension (CD) of an area where the gate is cut or etched to form the cross-couple is very small, e.g., about 18 nanometers (nm) in some devices. The CD means the smallest dimension that is printed for a given technology node. As devices scale to even smaller dimensions, the distance between adjacent transistors also becomes smaller, which makes such a gate cut challenging. One approach to address this challenge is to cut the gate (also referred to as the CT cut) as close to the PFET as possible, as this device is a dummy device. The PFET near the cut region is dummy PFET, which does not support any current flow. In such an approach, there would not be a concern when the distance between the gate cut region and the fin is small. However, because patterning can be imperfect and misalignment can occur, as the gate cut (CT cut) moves close to the dummy fin of the PFET, and the cross-couple contact between the gate and source/drain regions moves closer to the adjacent NFET, the cross-couple contact to the gate can be weakened. One reason for weakening of the contact is because the closer that the gate cut is to the PFET fin, the less gate metal is left to form the cross-couple. Further, if the cross-couple contact moves away from the PFET side due to poor overlay misalignment, the cross-couple contact becomes weak.

Turning now to an overview of the aspects of the invention, one or more embodiments of the invention address the above-described shortcomings of the prior art by providing methods and resulting SRAM device structures that include depositing a sacrificial material in a first opening formed in a dummy gate where a cross-coupling contact will be subsequently formed to form a placeholder. A dielectric material is deposited in a second opening of the gate, formed between adjacent transistors, and the dummy gate material is replaced with a metal gate stack. After depositing the metal gate stack, the sacrificial material forming the placeholder for the cross-couple contact is replaced with a contact metal. A portion of the metal gate stack, in particular the work function metal(s), lines each of a vertical sidewall and a horizontal endwall of the cross-couple contact, which shows that the position of the cross-couple contact is pre-defined before the metal gate stack is deposited.

The above-described aspects of the invention address the shortcomings of the prior art by providing methods and resulting structures that pre-define a cross-couple contact before the dummy gate is replaced with the metal gate stack. The pre-defined cross-couple contact mitigates patterning and misalignment that can occur as devices scale to smaller dimensions.

Turning now to a more detailed description of aspects of the present invention, FIGS. 1A-8C depicts a process flow for forming a semiconductor device, in particular an SRAM device 100, according to embodiments of the present invention. Although the process flows shown in FIGS. 1A-8C are directed to a SRAM device, it is to be understood that the methods and structures for forming a cross-coupled contact are not limited to SRAM devices, but can be used in any memory device utilizing a cross-couple contact. FIG. 1A depicts a top view of the SRAM device 100, subsequent to forming dummy gates 108, source/drain regions 104 (see FIGS. 1B and 1C) and depositing an interlayer dielectric (ILD 102). FIGS. 1B, 1C, 1D, and 1E each depicts a cross-sectional side view through the X1 axis, X2 axis, Y1 axis, and Y2 axis, respectively, of FIG. 1A.

The SRAM device 100 includes a two NFETs 130, two PFETs 132, and another set of two NFETs 134 (six total transistors). Two dummy gates 108 are shown. Each of the two NFETs 130 includes two fins 112 beneath the dummy gate 108. The fins 112 are formed in the substrate material. Each of the two NFETs 134 includes two fins beneath the dummy gate 108. The fins 112 of the PFET 132 are cut before forming the dummy gates 108 as shown in FIG. 1A, wherein the cross-couples will be formed nearby. Each of the two PFETs 132 includes one fin 112, with the device close to the cut fin being the dummy device. Cross-couple contacts (see FIGS. 8A-8C) will be formed between the gate of the first inverter and shared source/drains of second inverter, and also between the gate of the second inverter and shared source/drain of first inverter.

The substrate material of the fins 112 includes one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

Dummy gates 108 formed on the fins 112 each include a dummy gate material 140 (also referred to as a sacrificial gate material), a hard mask cap 106, and sidewall spacers 114. The dummy gate material 140 includes, for example, a thin layer of $SiO_2$ followed by amorphous silicon (aSi) or polycrystalline silicon (polysilicon). The hard mask cap 106 includes an insulating hard mask material, for example, silicon nitride, SiOCN, or SiBCN. The sidewall spacers 114 also include an insulating material, for example, silicon dioxide, silicon nitride, SiOCN, or SiBCN.

Figure 1B:
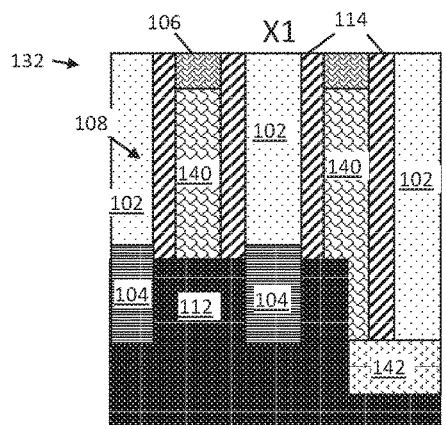
FIG. 1B depicts a cross-sectional side view through the X1 axis of FIG. 1A.
Figure 1C:
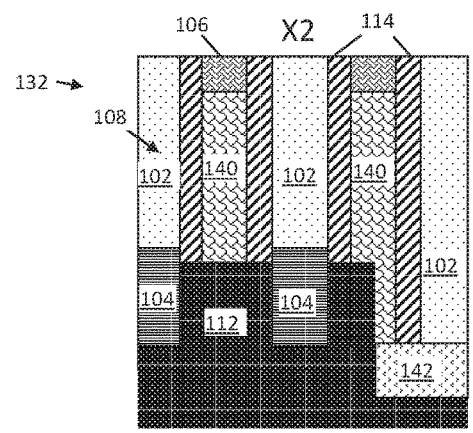
FIG. 1C depicts a cross-sectional side view through the X2 axis of FIG. 1A.
Figure 1D:
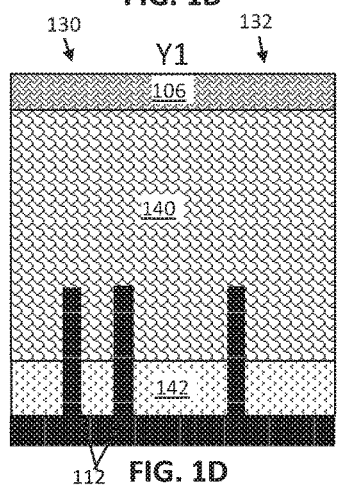
FIG. 1D depicts a cross-sectional side view through the Y1 axis of FIG. 1A.
Figure 1E:
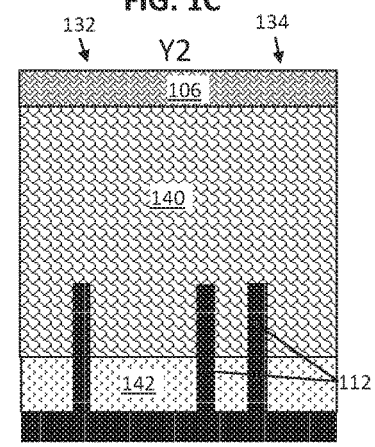
FIG. 1E depicts a cross-sectional side view through the Y2 axis of FIG. 1A.

The source/drain regions 104 are arranged between adjacent dummy gates 108 and each includes an epitaxial layer formed by an epitaxial growth process, as shown in FIGS. 1B and 1C. The epitaxial semiconductor material, such as for example, silicon, silicon germanium, and/or carbon doped silicon can be doped during deposition by adding a dopant or impurity to form a heavily doped source/drain epitaxial region.

The ILD 102 is arranged on the source/drain regions 104. After deposition, the ILD 102 is planarized by a planarization process, for example, chemical mechanical planarization (CMP). The ILD 102 can be formed from, for example, a dielectric material or a low-k dielectric material. Non-limiting examples of materials for the ILD 102 include silicon oxide, spin-on-glass, a flowable oxide, a high density plasma oxide, borophosphosilicate glass (BPSG), or any combination thereof.

Isolation regions 142 are arranged between the fins 112. The isolation regions 142 are formed by any known method in the art, including, for example, lithography or etching to form trenches, and then filling the trenches with an insulating material, such as silicon dioxide. The isolation regions 142 provide isolation between neighboring gate structure regions between adjacent devices.

Figure 2:
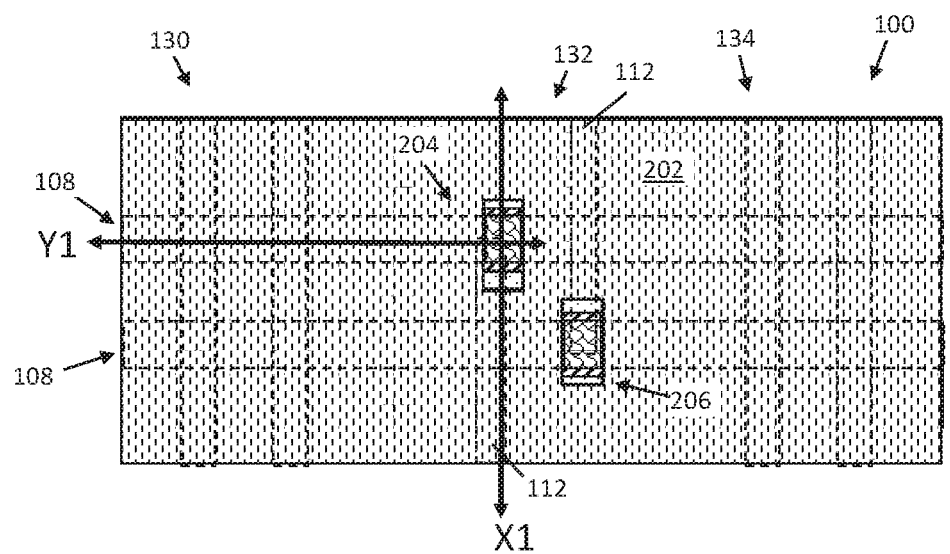

FIG. 2 depicts a top view of the SRAM device 100, subsequent to cross-couple contact patterning and etching the dummy gate material 140. A mask 202 is deposited on the dummy gates 108. The mask 202 can be, for example, a resist material, such as a photoresist material, or a planarization layer, such as an organic planarization layer (OPL), or a combination thereof.

The mask 202 is patterned to form openings 204, 206. A portion of the dummy gate material 140 is removed beneath the openings 204, 206 in the mask 202, for example, by etching. The resulting openings 204, 206 formed in the dummy gates 108 are also referred to as first openings in the dummy gates 108. This patterning step pre-defines the location of the cross-coupling contacts that will be subsequently formed.

Opening 206 is symmetrically aligned over the fin 112. Opening 204 is misaligned over the fin 112. Differently positioned openings are shown to illustrate that misalignment does not significantly impact cross-coupling using the described methods.

Figure 3A:
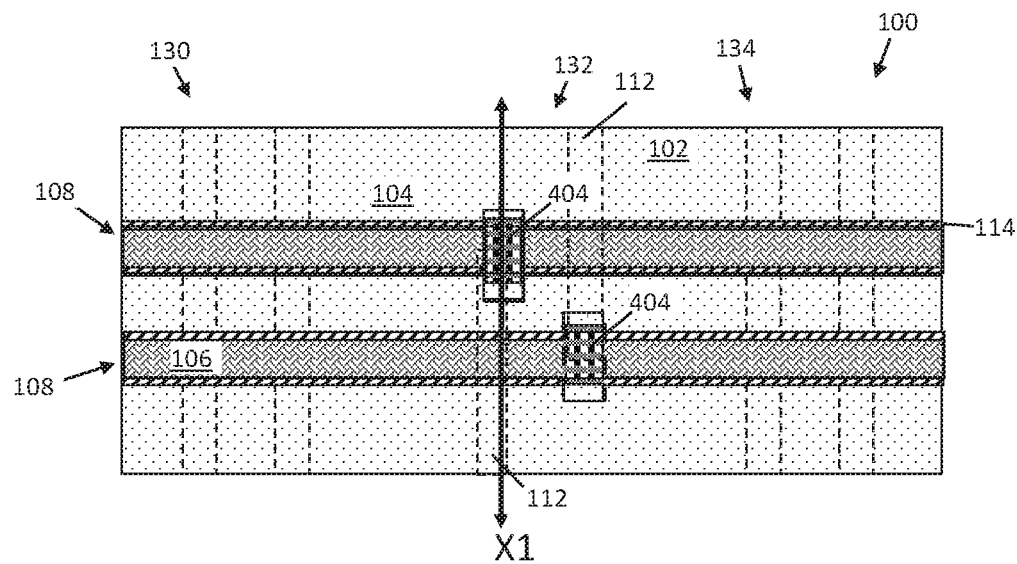
FIG. 3A depicts a top view of the SRAM device, subsequent to removing sidewall spacer material and depositing a sacrificial material.
Figure 3B:
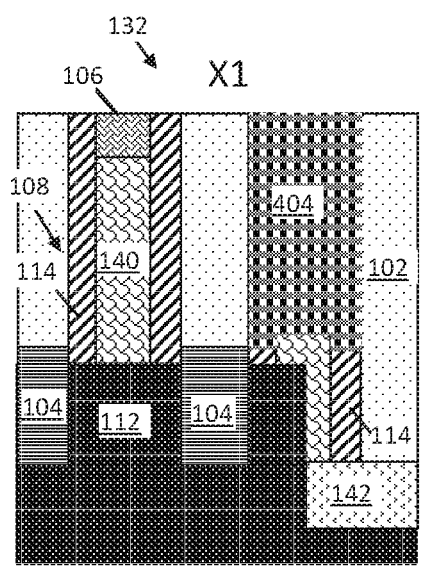
FIG. 3B depicts a cross-sectional side view through the X1 axis of FIG. 3A.

FIG. 3A depicts a top view of the SRAM device 100, subsequent to removing hard mask cap 106, dummy gate material 140, sidewall spacer 114 material, and mask 202, and depositing a sacrificial material 404. FIG. 3B depicts a cross-sectional side view through the X1 axis of FIG. 3A. The dummy gate material 140, sidewall spacer 114 material beneath the openings 204, 206 are removed down to about the level of the fin 112. The sidewall spacer 114 can be removed by, for example, one or more etching processes.

The mask 202 is removed, and a sacrificial material 404 is deposited to fill the space in the ILD 102 previously occupied by the dummy gate material 140 and sidewall spacers 114. After depositing the sacrificial material 404, a planarization process, such as CMP, is performed to remove excess material. The sacrificial material 404 provides a placeholder for the cross-couple contact that will later be formed in this area of the dummy gate 108, which will later be replaced to form a metal gate stack.

According to one or more embodiments of the present invention, the sacrificial material 404 is silicon carbide (SiC). Other non-limiting examples for the sacrificial material include SiCO and $AlO_x$.

Figure 4:
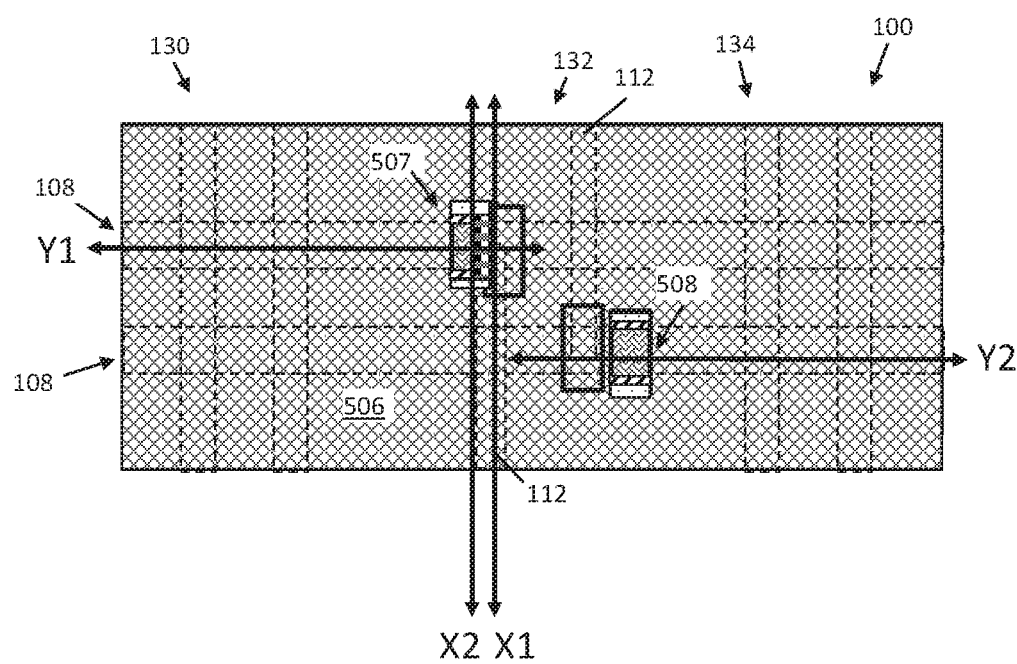

FIG. 4 depicts a top view of the SRAM device 100, subsequent to patterning a mask 506 for cutting the dummy gates 108. The mask 506 can include, but is not limited to, a planarization layer (e.g., an organic planarization layer) and an anti-reflective coating. The mask is deposited and patterned by forming openings 507, 508 in the mask. The openings 507, 508 are arranged over (vertical with respect to) the dummy gate 108 and adjacent to openings 204, 206 (see FIG. 2). The openings 507, 508 define the area where the dummy gate 108 will be severed or cut between adjacent transistors.

Opening 508, which is adjacent to but does not touch opening 206 (see FIG. 2), represents an ideal case. Opening 507, which vertically overlaps with opening 204 (see FIG. 2), represents what happens when misalignment occurs.

Figure 5A:
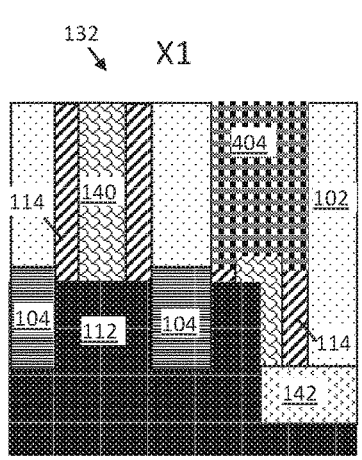
FIG. 5A depicts a cross-sectional side view through the X1 axis of FIG. 4, subsequent to removing the gate material and depositing a dielectric material in the open gate regions.
Figure 5B:
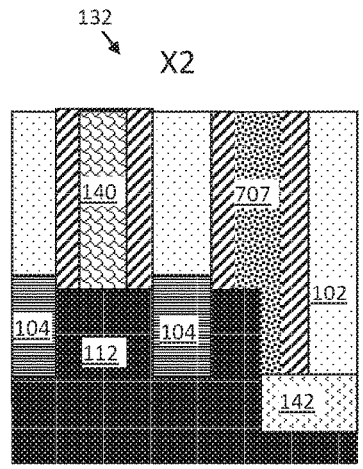
FIG. 5B depicts a cross-sectional side view through the X2 axis of FIG. 4, subsequent to removing the gate material and depositing a dielectric material in the open gate regions.
Figure 5C:
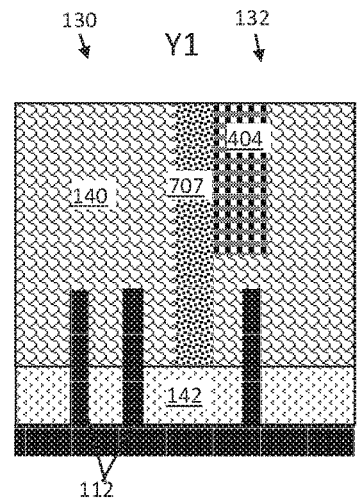
FIG. 5C depicts a cross-sectional side view through the Y1 axis of FIG. 4, subsequent to removing the gate material and depositing a dielectric material in the open gate regions.

FIGS. 5A, 5B, and 5C each depicts cross-sectional side view through the X1, X2, and Y1 axis, respectively, of FIG. 4, subsequent to removing the dummy gate material 140 from the dummy gate 108 beneath the openings 507, 508 and depositing a dielectric material 707 in the open gate regions. The dummy gate material 140 is removed by, for example, etching, to form in the dummy gate 108. The etching process is selective to (does not etch) the sacrificial material 404 that is exposed in opening 507, when mask misalignment occurs. As shown, when misalignment occurs, the critical dimension (CD) of the opening of the area where the gate is cut and filled with the dielectric material 707 (also referred to as the "CT" cut) (see FIG. 5C) is smaller than the critical dimension of the originally printed size of opening 507 in the mask 506.

The patterning mask is removed, and a dielectric material 707 is deposited in the open gate regions. Non-limiting examples of dielectric materials 707 include dielectric oxides (e.g., silicon oxide), dielectric nitrides (e.g., silicon nitride), dielectric oxynitrides, or any combination thereof. A planarization process, such as CMP, is performed to remove excess dielectric material 707 from top surfaces.

As shown in FIG. 5C, when misalignment occurs (see also FIG. 4), the critical dimension (CD) of the dielectric material 707 where the dummy gate 108 is cut is smaller than the critical dimension of the original opening 507 in the mask 506. However, when alignment is close to ideal, the critical dimension of the dielectric material 707 wherein the dummy gate 108 is cut is about the same as the critical dimension of the original opening 508 in the mask 506 (see FIG. 6B). Therefore, it can be seen that when gate area where the gate is cut (also referred to as a CT cut), including the dielectric material 707, does not touch the dummy cross-couple contact (see FIG. 6B), the CD of this gate cut area is larger than the CD of the gate cut area (CT cut), including the dielectric material 707 (see FIG. 6A), which abuts to the cross-couple contact (including the sacrificial material 404). The reason for this difference in CD is due to using a self-aligned gate cut (CT cut) patterning process where the gate etch process selectively etches the dummy gate material 140 with respect to dummy cross-couple fill material (sacrificial material 404).

Figure 6A:
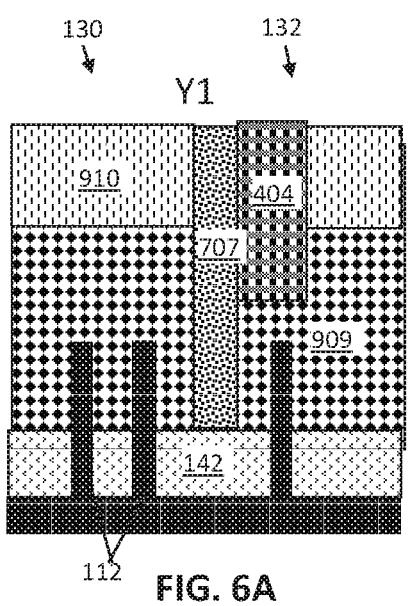
FIG. 6A depicts a cross-sectional side view through the Y1 axis, subsequent to removing sacrificial gate material and depositing a metal gate stack and hard mask cap.
Figure 6B:
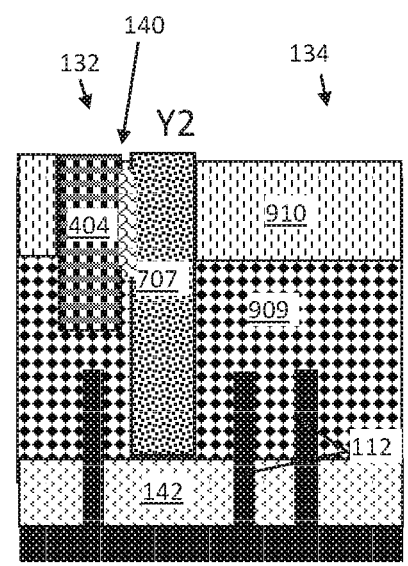
FIG. 6B depicts a cross-sectional side view through the Y2 axis, subsequent to removing sacrificial gate material and depositing a metal gate stack and hard mask cap.

FIGS. 6A and 6B each depicts a cross-sectional side view through the Y1 and y2 axis, respectively, subsequent to removing remaining residual dummy gate material 140 and depositing a metal gate stack 909, recessing the metal stack 909, and forming a gate dielectric cap 910. The remaining dummy gate material 140 is removed by, for example, one or more etching processes. It is noted that residual dummy gate material 140 can remain between sacrificial material 404 and dielectric material 707, as shown in FIG. 6B, without affecting the intended final structure.

The dummy gates 108 are replaced with metal gates by depositing a metal gate stack 909. The metal gate stack 909 includes one or more dielectric materials, one or more work function metals, and one or more metal gate conductor materials. Non-limiting examples of suitable materials for the dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The work function metal is disposed over the gate dielectric material. The type of work function metal(s) depends on the type of transistor. Non-limiting examples of suitable work function metals include p-type work function metal materials and n-type work function metal materials. P-type work function materials include compositions such as TiN, ruthenium, palladium, platinum, cobalt, nickel, and conductive metal oxides, or any combination thereof. N-type metal materials include compositions such as, TiC, TiAlC, hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the dielectric material and work function metal to form the metal gate stacks 909. Non-limiting examples of suitable conductive metals include ruthenium, tungsten, cobalt, aluminum, platinum, gold, tungsten, titanium, or any combination thereof.

According to some embodiments of the present invention, the metal gate stack 909 includes a dielectric layer, a first work function layer (e.g., TiN), a second work function layer (e.g., TiC), and a conductive metal (e.g., tungsten).

To form the gate dielectric cap 910 (also referred to as a gate cap), a portion of the metal gate stack 909 is removed to form a recess over the metal gate stack 909 and a dielectric material is deposited in the recess. Non-limiting examples of gate dielectric materials include silicon nitride, SiOCN, SiBCN, or a combination thereof.

Figure 7A:
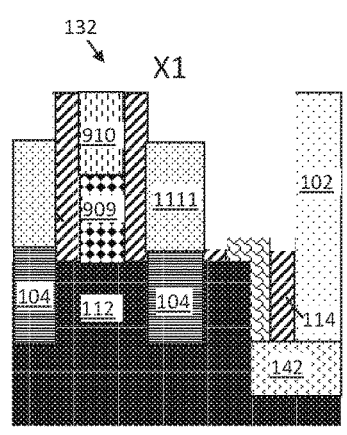
FIG. 7A depicts a cross-sectional side view through the X1 axis, subsequent to patterning the source/drain contacts, removing the ILD, depositing a protective layer, and removing the sacrificial material.
Figure 7B:
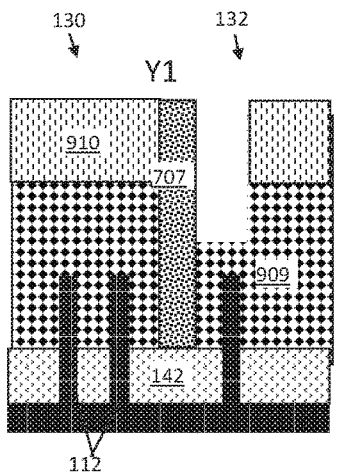
FIG. 7B depicts a cross-sectional side view through the Y1 axis, subsequent to patterning the source/drain contacts, removing the ILD, depositing a protective layer, and removing the sacrificial material.
Figure 7C:
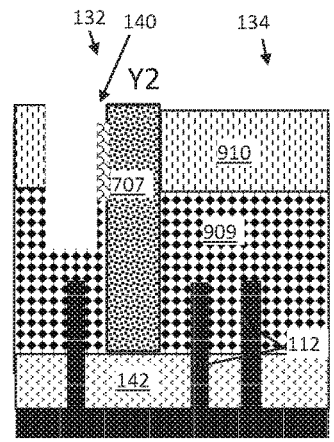
FIG. 7C depicts a cross-sectional side view through the Y1 axis, subsequent to patterning the source/drain contacts, removing the ILD, depositing a protective layer, and removing the sacrificial material.

FIGS. 7A, 7B, and 7C each depicts a cross-sectional side view through the X1, X2, and Y2 axis, respectively, subsequent to patterning the source/drain contacts, removing ILD 102 over source/drain regions 104, depositing a protective layer 111, and removing the sacrificial material 404.

A mask (not shown) is deposited and patterned to form openings over source/drain regions 104 where source/drain contacts will be formed. The ILD 102 is removed by, for example, etching, to expose the source/drain regions 104 in areas beneath openings in the mask 1000. The protective layer 1111 deposited on the source/drain regions 104 can be, for example, an organic planarization layer. The protective layer 1111 is partially recessed to a level below the top of the gate cap 910. The protective layer 1111 protects the source/drain regions 104 during subsequent processing steps.

The sacrificial material 404 (from FIGS. 6A and 6B) is selectively removed. The sacrificial material 404 can be removed by etching, for example, which depends on the type of material used. Removing the sacrificial material 404 exposes the metal gate stack 909.

Figure 8A:
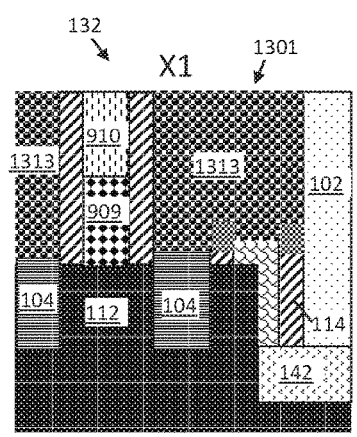
FIG. 8A depicts a cross-sectional side view through the X1 axis, subsequent to removing any exposed gate dielectric and the protective layer, and then metallizing the source/drains and cross-couple contacts.
Figure 8B:
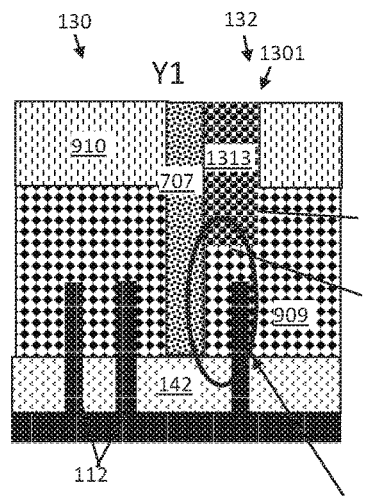
FIG. 8B depicts a cross-sectional side view through the Y1 axis, subsequent to removing any exposed gate dielectric and the protective layer, and then metallizing the source/drains and cross-couple contacts.
Figure 8C:
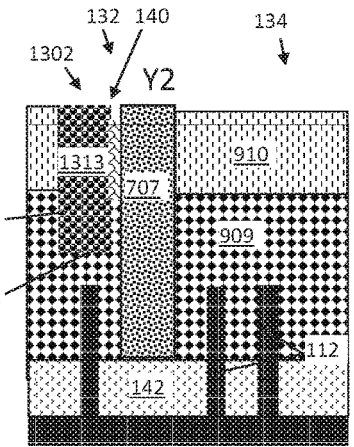

FIGS. 8A, 8B, and 8C each depicts a cross-sectional side view through the X1, Y1, and Y2 axis, respectively, subsequent to removing any exposed gate dielectric material (e.g., high-k dielectric) between the opening previously containing the sacrificial material 404 and the metal gate stack 909. Then, the protective layer 111 is removed, and the source/drains and cross-couple contacts are metallized simultaneously by depositing a contact metal 1313.

Because the gate dielectric material is removed in the area 888 (see FIG. 8B) beneath the contact metal 1313 of the cross-couple contact 1301, only the work function metal layer(s) of the metal gate stack 909 remain in the area 888 beneath the contact metal 1313 of the cross-couple contact 1301. According to some exemplary embodiments of the present invention, the work function metal in the area 888 beneath the cross-couple contact 1301 include two work function metals, e.g., TiN and TiC. The work function metals therefore fill the area 888 between the cut fin 112 and the dielectric material 707 in the gate cut area. The work function metals also line the vertical sidewall of the contact metal, such that the work function metals of the gate stack 909 surround and contact the endwall and the vertical sidewall of the contact metal 1313 (see FIG. 8B).

Non-limiting examples of contact metals 1313 for the cross-couple contact 1301, 1302 include thin silicide liner materials, such as PVD Ti; barrier or adhesion layers, such as ALD TiN; and low resistance metal fill such as Co, Ru, W, and Cu.

The cross-couple contacts 1301, 1302 are arranged on the metal gate stack 909, and the metal gate stack 909 follows the contours of the pre-defined cross-couple. The metal gate stack 909 directly contacts at least a vertical sidewall 801 (first sidewall) and horizontal endwall 802 (bottom endwall) of the cross-couple contacts 1301, 1302.

In some embodiments of the present invention, a portion of the sacrificial gate material (or dummy gate material 140) contacts a second vertical sidewall (or second sidewall) of the cross-couple contact, as shown in FIG. 8C.

In other embodiments of the present invention, the cross-couple contact 1301 directly contacts dielectric material 707 that extends to the isolation region 142 where the gate was cut (see FIG. 8B).

Yet, in some embodiments of the present invention, the gate dielectric cap 910 arranged on the metal gate stack 909 contacts another portion of the first sidewall of the cross-couple contact 1301.

When the area where the gate is cut (also referred to as a CT cut), including the dielectric material 707, does not touch the cross-couple contact 1302 (see FIG. 8C), the CD of this gate cut area is larger than the CD of the gate cut area (CT cut), including the dielectric material 707 (see FIG. 8B), which abuts to the cross-couple contact 1301.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a memory device, the method comprising:
   forming a sacrificial material; and
   replacing the sacrificial material with a metal to form a cross-couple contact on a metal gate stack, the metal gate stack directly contacting and lining both vertical sidewalls and a bottom endwall of the cross-couple contact, the vertical sidewalls being parallel to one another, and the bottom endwall being a distal bottom endwall connecting the vertical sidewalls;
   wherein the method further comprises, prior to replacing the sacrificial material, patterning and etching a dummy gate to form a first opening in the dummy gate; and depositing the sacrificial material in the first opening to form a placeholder for the cross-couple contact.

2. The method of claim 1 further comprising patterning and etching the dummy gate, selective to the sacrificial material, to form a second opening in the dummy gate.

3. The method of claim 2 further comprising depositing a dielectric material in the second opening in the dummy gate.

4. The method of claim 3 further comprising replacing the dummy gate with the metal gate stack.

5. The method of claim 1, wherein the sacrificial material comprises silicon carbide.

6. A method of fabricating a memory device, the method comprising:
   forming a sacrificial material; and
   replacing the sacrificial material with a metal to form a cross-couple contact on a metal gate stack, the metal gate stack directly contacting and lining first and second vertical sidewalls and a bottom endwall of the cross-couple contact, the vertical sidewalls being parallel to one another, and the bottom endwall being a distal bottom endwall connecting the vertical sidewalls, and dummy gate material contacting the second vertical sidewall of the cross-couple contact.

7. The method of claim 6 further comprising, prior to replacing the sacrificial material, patterning and etching a dummy gate to form a first opening in the dummy gate; and depositing the sacrificial material in the first opening to form a placeholder for the cross-couple contact.

8. The method of claim 7 further comprising patterning and etching the dummy gate, selective to the sacrificial material, to form a second opening in the dummy gate.

9. The method of claim 8 further comprising depositing a dielectric material in the second opening in the dummy gate.

10. The method of claim 9 further comprising replacing the dummy gate with the metal gate stack.

11. The method of claim 6, wherein the sacrificial material comprises silicon carbide.

12. The method of claim 6, wherein the dummy gate material comprises amorphous silicon or polysilicon.

* * * * *